United States Patent [19]

Ruegg

[11] 3,890,634

[45] June 17, 1975

[54] TRANSISTOR CIRCUIT

[75] Inventor: Heinz Walter Ruegg, Hausena, Switzerland

[73] Assignee: U.S. Philips Corporation, New York, N.Y.

[22] Filed: Nov. 21, 1973

[21] Appl. No.: 418,210

Related U.S. Application Data

[63] Continuation of Ser. No. 189,086, Oct. 14, 1971, abandoned.

[30] Foreign Application Priority Data

Oct. 23, 1970 Netherlands ...................... 7015520

[52] U.S. Cl. ...................... 357/40; 357/35; 357/48; 357/37; 307/237; 307/303

[51] Int. Cl. ........................................... H01l 19/00

[58] Field of Search ........ 317/235 Y, 235 D, 235 E, 317/235 AA; 307/237, 303; 357/35, 40, 48, 37

[56] References Cited

UNITED STATES PATENTS

| | | | |
|---|---|---|---|
| 3,482,111 | 12/1969 | Gunderson et al. | 307/237 |
| 3,487,233 | 12/1969 | Reap | 317/235 |
| 3,590,345 | 6/1971 | Brewer et al. | 317/235 |

OTHER PUBLICATIONS

C. Cook et al., "New Semiconductor Networks Reduce System Complexity," Electronics, Jan. 10, 1964, pp. 25–29.

T. Collins, "Transistor–Collector Clamp," I.B.M. Tech. Discl. Bull., Vol. 10, No. 2, July, 1967, p. 180.

Electronics, Apr. 3, 1967, p. 44.

*Primary Examiner*—Andrew J. James
*Assistant Examiner*—Joseph E. Clawson, Jr.
*Attorney, Agent, or Firm*—Frank R. Trifari; Ronald L. Drumheller

[57] ABSTRACT

A lateral region detects the saturation condition and provides overflow negative feedback or a trigger preparation voltage.

5 Claims, 5 Drawing Figures

Figure 1:
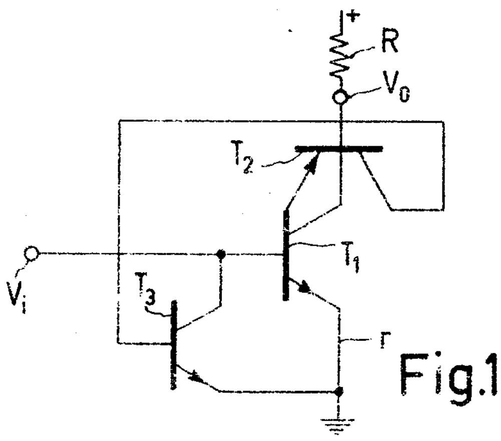

INVENTOR.

HEINZ W.RUEGG

BY [signature]

AGENT

PATENTED JUN 17 1975

3,890,634

SHEET 2

INVENTOR.

HEINZ W.RUEGG

BY

AGENT

TRANSISTOR CIRCUIT

This is a continuation of application Ser. No. 189,086, filed Oct. 14, 1971, and now abandoned.

The invention relates to a transistor circuit including means for detecting the saturation condition of a transistor. In a known circuit, as soon as the base-collector junction of the transistor is operated in the forward direction, a second transistor is rendered conductive so that a current becomes available. This current may be used, for example, for further driving of the first transistor so as to prevent excessive charge storage in its base. Another use consists in that this current, of the corresponding voltage, is used for sensitive conditioning of a trigger circuit, as will be set out more fully hereinafter. The term "saturation" is used in this connection to mean that the first transistor becomes so highly conductive that the collector injects charges into the base and vice versa.

The circuit according to the invention is particularly suitable for construction as an integrated circuit. In this case it is of importance that the use of circuit elements which occupy much space should be avoided as far as possible. Hence, the use of inductance in the integrated circuit element is out of the question, whilst the number of capacitors and resistors should be restricted to a minimum. This also ensures that the circuit is suitable for very high frequencies and may be operated with pulses of very short duration. Such a property is of great advantage in logic circuits.

The invention is characterized in that laterally of a region surrounded by the collector-base junction of the (first) transistor a further region of the same conductivity type is provided which forms the collector region of a (second) lateral transistor the emitter-base junction of which corresponds to the base-collector junction of the first transistor, and in that during the saturation of the first transistor charges collected by the collector of the second transistor are supplied to an impedance across which a voltage is produced which depends upon the saturation condition of the first transistor.

In a preferred embodiment of the invention there is provided near the base region of a first transversal transistor constructed according to the integrated-circuit technology the further region of the same conductivity type as this base region, which further region is separated from this base region by the collector region of the transversal transistor in a manner such that the lateral (second) transistor of a conductivity type opposite to that of the transversal (first) transistor is obtained, the collector of this lateral transistor being constituted by the further region, charges collected by this collector being supplied to the impedance across which a voltage depending upon the saturation condition is produced.

This impedance preferably takes the form of the base-emitter path of a third transistor to the input electrode of which more remote from the collector of the second transistor the same potential is applied as to the emitter of the first-mentioned transistor. This ensures that at the occurrence of the saturation of the first transistor the voltage produced at the collector of the second transistor has just the right value to drive the base of the third transistor without the need for additional circuit elements. Obviously, a resistor and/or a further amplifier may be included in the connection between the collector of the second transistor and the base of the third transistor, but as a rule such circuit elements can be dispensed with so that a single connection is sufficient. Thus a very simple and effective circuit is produced which may readily be manufactured in integrated circuit form.

Another embodiment is characterized in that in a transistor circuit including means for determining the saturation of a first transistor the base-collector path of which is shunted by the emitter-base path of a second transistor a third transistor is provided, the collector of the second transistor being connected to an input electrode (the base or the emitter) of the third transistor, the other input electrode (the emitter or the base) of which is at substantially the same potential as the emitter of the first transistor.

It is known to provide near the base region of a first transversal transistor a further region so that a second lateral transistor of the opposite conductivity type is formed. However, this further region usually has a voltage applied to it such that it acts as the emitter of the second transistor. In contradistinction thereto, in the circuit according to the invention a further region is biased so that it is operated as a collector and only delivers a corresponding voltage after saturation.

Figure 2:
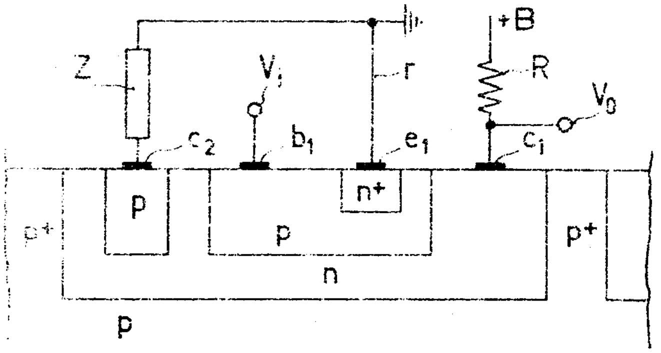
Figure 2A:
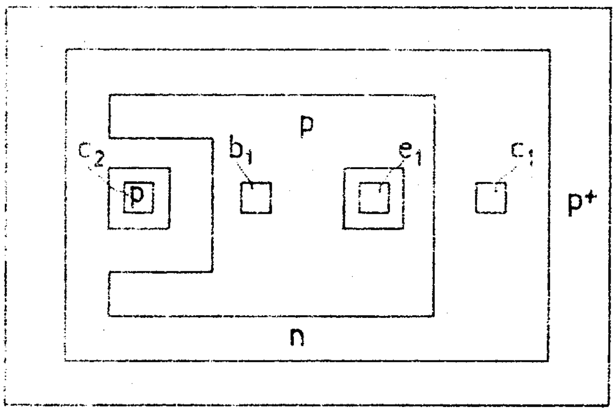
Figure 3:
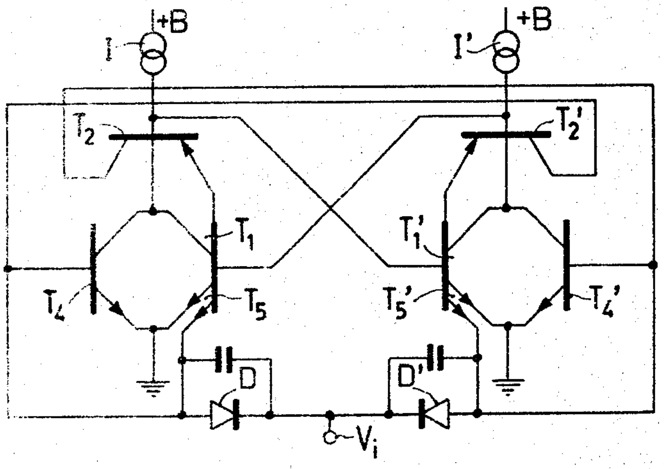
Figure 4:
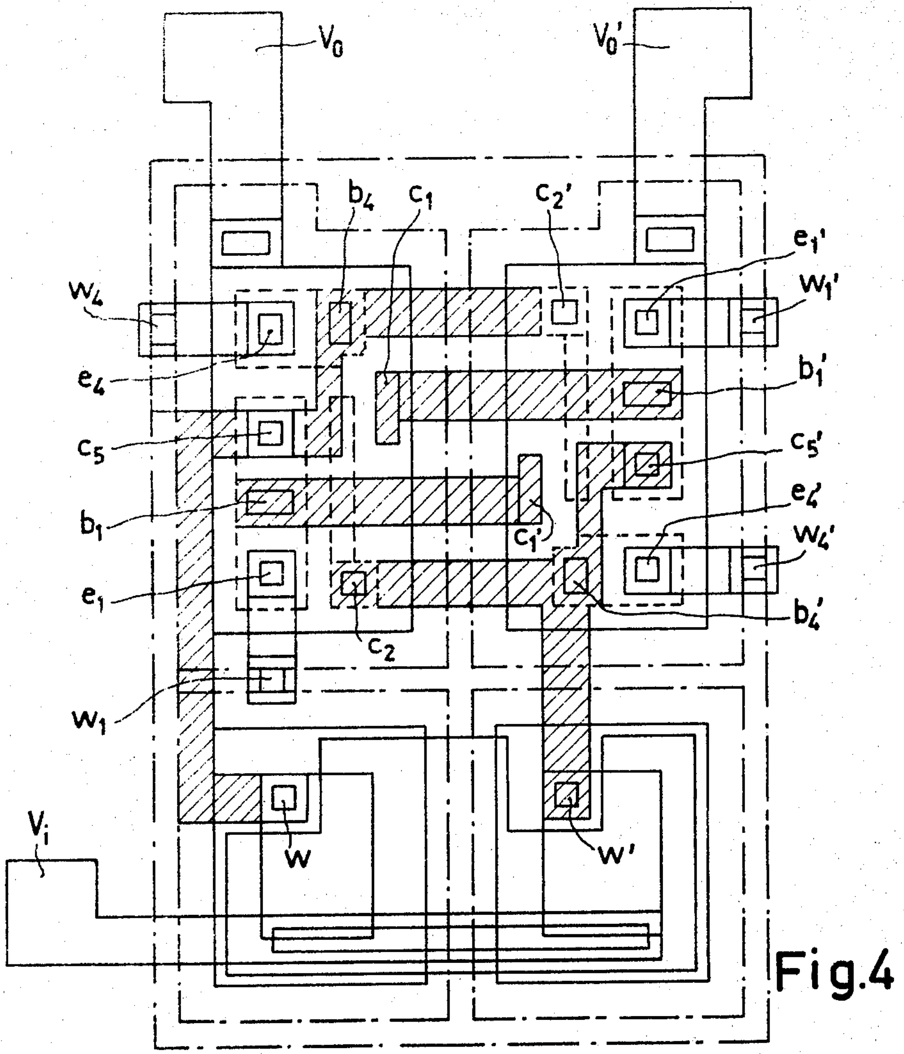

Embodiments of the invention will now be described, by way of example, with reference to the accompanying diagrammatic drawings, in which:

FIG. 1 is a schematic circuit diagram of an amplifier according to the invention, FIG. 2 is a sectional view and a top plan view (FIG. 2*a*) of the corresponding integrated semiconductor element, FIG. 3 is another circuit diagram in which the principle of the invention is used, and FIG. 4 shows the circuit element of FIG. 3 in integrated-circuit form.

Referring now to FIG. 1, there is shown a first transistor $T_1$ of the NPN type. The emitter of this transistor is, for example, at earth potential; to its base an input voltage $V_i$ is applied and from its collector an amplified signal, for example, an amplified voltage $V_0$ set up across a load resistor R, is derived. With increasing input voltage $V_i$ the voltage at the collector of the transistor $T_1$ decreases until a value about equal to the value of the emitter potential (earth potential) has been reached. At so low a collector voltage the voltage at the base of the transistor $T_1$ becomes more positive than its collector voltage, so that the collector-base junction is operated in the forward direction and the collector starts injecting charges into the base, and vice versa.

It is an object of the invention to detect this saturation condition, to eliminate the inconvenient consequences thereof and to use the voltage variation resulting from this detection for further adjustments of the circuit. In particular, excessive charge storage in the base is avoided and the trigger circuit may sensitively be put into a state of readiness.

FIG. 2 shows the construction of a semiconductor element according to the invention. By conventional integrated-circuit techniques an N-type island provided with a collector contact $c_1$ is formed in a P-type substrate. Into this island P-type regions provided with a base contact $b_1$ and a collector contact $c_2$ respectively are simultaneously diffused so near one another that a lateral PNP effect is obtainable. (For this purpose the spacing must be smaller than the diffusion length of the minority carriers — i.e., the holes — in the N-type region which separates the P-type regions.) Furthermore an $N^+$-type region provided with an emitter contact $e_1$ is formed in one of the P-type regions.

The $n^+$, $p$ and $n$ regions connected to the contacts $e_1$, $b_1$ and $c_1$ form a transversal transistor which corresponds to the transistor $T_1$ of FIG. 1. The $p$, $n$ and $p$ regions connected to the contacts $b_1$, $c_1$ and $c_2$ form the above-described lateral transistor which corresponds to the transistor $T_2$ of FIG. 1. The contact $c_2$ is connected to earth through an impedance Z, which in FIG. 1 is constituted by the base-emitter path of the transistor $T_3$. Owing to this connection $c_2$ will act as the collector, $b_1$ as the emitter and $c_1$ as the base of this lateral transistor.

When an increasing positive voltage $V_i$ is applied to the contact $b_1$ (a negative voltage $V_i$ would have no effect at all, since in this case all the PN junctions would be blocked), the voltage $V_0$ at the contact $c_1$ gradually decreases from +B (the supply voltage) to earth potential. As long as $V_i$ is less positive than $V_0$, the PN junction between the regions connected to the contacts $b_1$ and $c_1$ is operated in the reverse direction and hence the lateral *pnp* transistor ($T_2$ in FIG. 1) remains cut off. When, however, $V_i$ becomes more positive than $V_0$ (commencement of the saturation of $T_1$), the *p*-type region connected to $b_1$ starts injecting holes into the *n*-type region connected to $c_1$, which are collected by the adjacent *p*-type region connected to $c_2$, because just this region then is at a negative voltage relative to $V_i$.

Such an effect may also be produced if the transistor $T_2$ were located in a separate island, its emitter-base path shunting the base-collector path of the transistor $T_1$. Not only would this require more space, but also the topology shown in FIG. 2 has the large advantage that immediately at the location at which the collector-base junction of the transversal transistor starts injecting — i.e., the point at which saturation occurs — the *p*-type region connected to $c_2$ collects part of these injected carriers, so that the voltage variation at the contact $c_2$ can further be utilised, for the current flows from +B through R and $c_1$, then passes through the transversal transistor and subsequently flows from $e_1$ to earth; hence the voltage at $c_1$ is more positive than the voltage in the N-type collector region in the immediate proximity of the collector-base junction, so that this junction may already be in the injection range before the voltage at the contact $c_1$ has dropped below the voltage at the contact $b_1$.

In practice the transversal *npn* transistor will be fully saturated at an input voltage $V_i$ of about +0.6 volt. The voltage at the collector contact $c_1$ will then have dropped to only a few tenths of a millivolt. The lateral *pnp* transistor is conductive and the voltage at the contact $c_2$ will remain a few tenths of a millivolt below the input voltage $V_i$ (= 0.6 volt). This voltage has exactly the correct value to render conductive the transistor $T_3$ of FIG. 1 which is connected in parallel with the signal source. As a result, a heavier load is imposed upon the input signal source, which has a high internal resistance, and the voltage $V_i$ does not rise further, but to the base of the transistor $T_1$ only so much current is supplied as is required for the saturation condition. Thus, excessive charge storage in the base region of the transistor $T_1$ is avoided, so that the speed of the circuit arrangement when operated with pulse signals is increased. This is the reason why the *p*-type region connected to $c_2$ is provided opposite only part of the *p*-type region connected to $b_1$, so that it has only a low internal capacitance. This region may even be surrounded (for example partly) by the *p*-type region connected to $b_1$, as is shown in the plan view of FIG. 2*a*, to obtain a high inverse base-collector current gain factor of the lateral *pnp* transistor.

To compensate for the aforementioned loss of a few tenths of a millivolt the transistor $T_3$ may be given an emitter surface area larger than that of the transistor $T_1$, so that $T_3$ is rendered conductive at a lower base voltage than is $T_1$. Alternatively, there may be included in the emitter supply lead $r$ of the transistor $T_1$ a resistor which occupies comparatively little space, so that the voltage $V_i$ must be increased by the voltage drop across this resistor (for example of the order of magnitude of 50 millivolts) before saturation of the transistor $T_1$ occurs. Because the emitter of the transistor $T_3$ is directly connected to earth, however, this also ensures that $T_3$ becomes conductive as soon as $T_2$ starts conducting and hence saturation of $T_1$ occurs. Owing to the large overall amplification of the transistors $T_2$ and $T_3$, however, these steps are not absolutely necessary.

The embodiment shown in FIG. 3 shows the use of the principle according to the invention for putting a flip-flop circuit into a state of readiness for changing its condition. The flip-flop circuit comprises two *npn* transistors $T_1$ and $T_1'$ the collector and base electrodes of which are cross-coupled. As has been described with reference to FIGS. 1 and 2, the sole provision of the *p*-type region connected to $c_2$ gives rise to the formation of a lateral transistor $T_2$ the collector of which is constituted by this *p*-type region. In FIG. 3 also, the lateral transistor associated with the transversal transistor $T_1$ is denoted by $T_2$; the lateral transistor similarly associated with the transversal transistor $T_1'$ is denoted by $T_2'$. The collector of these transistors, however, are connected to the bases of two further transistors $T_4'$ and $T_4$ respectively the emitter-collector paths of which are connected in parallel with those of the transistors $T_1'$ and $T_1$ respectively.

It is assumed that in one stable condition of the flip-flop circuit the transistor $T_1$ is conducting. A current source I' will then produce a voltage of about 0.6 volt at its base, with consequent saturation. As has been described hereinbefore, a substantially equal voltage will then be produced at the collector of the transistor $T_2$, which voltage is transferred to the base of the transistor $T_4'$. Hence, the base of the transistor $T_4'$ is at a voltage of about 0.6 volt and that of the transistor $T_4$ is at about 0 volt. A positive trigger pulse $V_i$ of only from 0.1 to 0.2 volt when applied to these two bases causes the transistor $T_4'$ to become highly conducting, whilst the transistor $T_4$ is not yet conducting, so that the voltage at the base of the transistor $T_1$ will become 0 volt. As a result, $T_1$ and $T_2$ are cut off and the supply source I causes the transistor $T_1'$ to become conducting ($T_2$ cannot conduct in the reverse direction, because the collector-base junction of $T_2$ remains cut off owing to the supply voltage +B Which is made greater than 0.6 volt). After the trigger pulse $V_i$ has disappeared, the collector voltage of $T_2$, i.e., the base voltage of $T_4'$, drops to 0 volt, $T_4'$ is cut off and the flip-flop circuit remains in the opposite state with $T_1$ cut off and $T_1'$ conducting.

Because in this manner a voltage corresponding to the occurrence of saturation of the transistor $T_1$ is produced at the base of the transistor $T_4'$, the flip-flop circuit is put into a state of readiness such that a very small input pulse suffices to cause it to change state. Obviously, this effect will be obtained irrespective of the fact whether the transistor $T_4'$ is already conducting in the rest condition, i.e., irrespective of the fact whether the negative feedback of the base drive of the transistor $T_1$ has already commenced. Therefore, the above-described steps to shift this starting point (increased emitter surface area of $T_4'$ or of $T_4$ and/or the inclusion of resistors in the emitter supply leads of $T_1$ or $T_1'$) are not absolutely necessary.

When trigger pulses of, say, at least 0.6 volt are used, there is a risk that not only the transistor $T_4'$ becomes highly conducting, but that also the transistor $T_4$ becomes conducting, which would adversely affect the reliability of the change of state of the flip-flop circuit. To eliminate this risk the base of $T_4$ (and $T_4'$) is connected to a further region of the transistor $T_1$ ($T_1'$ respectively) which in the semiconductor element shown in FIG. 2 takes the form of a further $N^+$-type region, which is located beside the $n^+$-type region connected to $e_1$ and with this region forms a lateral *npn* transistor $T_5$ and hence is indicated in FIG. 3 by an emitter symbol, although this further region has the function of a collector, as will be explained hereinafter.

In the rest condition, in which $T_1$ is conducting and $T_1'$ is cut off, the voltage at the base of $T_4$ is 0 volt, as was set out hereinbefore. Because the base-emitter path common to the transistor $T_1$ and the transistor $T_5$ is conducting (owing to the saturation of the transistor $T_1$ electrons are also injected into the base of this transistor by its collector, and these electrons reach the collector of the transistor $T_5$) the base voltage of $T_4$ cannot become positive for this reason also. This condition does not change when the input pulse $V_i$ is received, as long as the transistor $T_1$ still is conducting. When, however, the transistor $T_1$ is cut off owing to the fact that the transistor $T_4'$ becomes conducting, the flip-flop circuit changes state and causes a positive voltage to be produced at the base of the transistor $T_4$ by the collector of the transistor $T_2'$ and by $V_i$. At the same time, the transistor $T_5'$ becomes conducting and discharges a capacitance connected between its emitter and the $V_i$ terminal. Instead of two diodes D and D' which act as capacitances (the capacitors shown in FIG. 3 form part of the equivalent circuit diagrams of these diodes) the pulse $V_i$ may also be applied through resistors to the bases of the transistors $T_4$ and $T_4'$, in which event the source which supplies the voltage $V_i$ is less heavily loaded. Alternatively, this source may take the form of a transistor having two collectors, one collector being connected to the connection between the collector of $T_5$ and the base of $T_4$ and the other being connected to the connection between the collector $T_5'$ and the base of $T_4'$.

FIG. 4 shows the topology of the semiconductor element shown in FIG. 3. The element contains four islands which are separated from one another by P-type island diffusion (dot-dash lines). The collector regions of the transistors $T_1$, $T_4$ and $T_1'$, $T_4'$ respectively, which are provided with buried layers, fill the island areas at the left-hand and the right-hand sides respectively of the upper part. The lower part contains the diodes (D and D' in FIG. 3) to which the input signal is applied by way of the contact area of $V_i$.

The anodes of these diodes are connected through openings *w* and *w'* to a contacting strip shown by shading which contacts the collector $c_5$ (and $c_5'$) of the transistor $T_5$ (and $T_5'$ respectively), the base $b_4$ (and $b_4'$) of the transistor $T_4$ (and $T_4'$ respectively) and the collector $c_2'$ (and $c_2$) of the transistor $T_2'$ (and $T_2$ respectively). The transistors $T_1$, $T_2$, $T_4$ and $T_5$ are located in the island at the upper left, whilst the transistors $T_1'$, $T_2'$, $T_1'$ and $T_5'$ are located in the island at the upper right. The emitter $e_1$ ($e_1'$) of the transistor $T_1$ ($T_1'$ respectively) is connected to the island diffusion region through the opening $W_1$ ($w_1'$). Similarly, the emitter $e_4$ ($e_4'$) of the transistor $T_4$ ($T_4'$ respectively) is connected to the island diffusion region through the opening $w_4$ ($w_4'$). The base $b_1(b_1')$ is connected to the collector region $c_1'$ ($c_1$ respectively) which is also connected to the output contact area $V_0'$ ($V_0$). The *p*-type doped regions are indicated by broken lines. The current sources connected to $V_0$ (and $V_0'$ respectively) generally are the collector-emitter paths of lateral PNP transistors. As will be seen from the Figure, the collector regions associated with $c_2$ (and $c_2'$ respectively) have been provided as comparatively small diffusion regions near the base regions associated with $b_1$ (and $b_1'$) and each form, together with the respective base region and the intermediate collector region, a lateral PNP transistor. The $n^+$-type regions associated with $e_1$ and $c_5$ together with the base region associated with $b_1$ form a lateral NPN transistor, and owing to the small size thereof, to the large diffusion length of the minority carriers and to the charges which by the injection of electrons from the collector into the base of the first transistor reach the collector $c_5$ the current gain is high enough to achieve the effects described with reference to FIG. 3. If desired, the regions associated with $e_1$ and $c_5$ may be adjacent to one another.

Obviously, many further modifications are possible. The current generated at the collector $c_2$ (or $c_2'$) may be supplied to the emitter of a further PNP transistor the base of which is earthed, and then be further utilized. The locations and sizes of the various regions of FIG. 4 may be altered without the desired effects being adversely affected. The dopings may be reversed, i.e., transversal PNP and lateral NPN transistors may be used. Also, complementary transversal and complementary lateral transistors may be provided on a semiconductor element. Furthermore, the first transistor $T_1$ may be a lateral transistor (for example a lateral PNP transistor), whilst the further (P-type) region which forms the collector of the transistor $T_2$ may be provided in the (N-type) base island laterally of the (P-type) collector region of the transistor $T_1$. In this case care should be taken to ensure that the (hole) charges injected into the base of the transistor $T_1$ by the emitter do not immediately reach the further region, for example by designing the (P-type) collector region of the first transistor as an annular (P-type) region surrounding its (P-type) emitter region, so that this further region collects (hole) charges only when the collector of the first transistor owing to saturation injects (hole) charges into its base, which reach the further region. It will be appreciated that this mutual decoupling between the emitter of the first transistor and the collector of the second transistor automatically occurs in the examples shown in FIGS. 2 and 4.

What is claimed is:

1. A solid state device comprising:

a first region of semiconductor material of one semiconductor type;

second and third regions of semiconductor material of the opposite semiconductor type forming mutually isolated islands within said first region, said second region being closely spaced from only a portion of the surface area of said third region by a portion of said first region, said portion of said first region having a width less than the diffusion length of minority carriers in said first region, whereby said portion of said first region acts substantially as the base region of a lateral transistor, said second and third regions respectively acting as the collector and emitter thereof;

a fourth region of semiconductor material of said one semiconductor type forming an isolated island within said third region, whereby said fourth region acts as the emitter region of a transversal transistor, said third and first regions respectively acting as the base and collector thereof;

a further transistor having a base of semiconductor material of said opposite semiconductor type and an emitter and collector of semiconductor material of said one semiconductor type, said base, emitter and collector being electrically connected to said second, fourth and third regions respectively, whereby said lateral transistor is conductive only when said transversal transistor is actually saturated and thereby causes said further transistor to limit saturation of said transversal transistor in response thereto; and means for making electrical connection to said third and fourth regions and to said first region at a location remote from said portion thereof spacing said second and third regions.

2. The solid state device of claim 1 wherein said one semiconductor type is N type and said opposite semiconductor type is P type.

3. The solid state device of claim 1 wherein said third region at least partly surrounds said second region.

4. The solid state device of claim 1 further comprising a substrate supporting said first region, said substrate being composed of semiconductor material of said opposite semiconductor type.

5. The solid state device of claim 1 wherein the emitter surface area of said further transistor is larger than the effective emitter surface area formed between said third and fourth regions.

* * * * *

UNITED STATES PATENT AND TRADEMARK OFFICE

CERTIFICATE OF CORRECTION

PATENT NO. : 3,890,634

DATED : June 17, 1975

INVENTOR(S) : HEINZ WALTER RUEGG

It is certified that error appears in the above-identified patent and that said Letters Patent are hereby corrected as shown below:

IN THE SPECIFICATION

Column 4, line 60, "Which" should be --which--;

Column 6, line 9, "$T_1$'" should be --$T_4$'--;

line 12, "$W_1$" should be --$w_1$--.

Signed and Sealed this

*twenty-fifth* Day of *May 1976*

[SEAL]

*Attest:*

RUTH C. MASON
*Attesting Officer*

C. MARSHALL DANN
*Commissioner of Patents and Trademarks*